United States Patent
Ito (10) Patent No.: US 6,594,187 B2
(45) Date of Patent: Jul. 15, 2003

(54) SEMICONDUCTOR MEMORY

(75) Inventor: Hiroshi Ito, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 61 days.

(21) Appl. No.: 09/988,738

(22) Filed: Nov. 20, 2001

(65) Prior Publication Data

US 2002/0060924 A1 May 23, 2002

(30) Foreign Application Priority Data

Nov. 20, 2000 (JP) ........................................ 2000-353237

(51) Int. Cl.[7] .............................. G11C 7/00; G11C 7/02
(52) U.S. Cl. ..................... 365/203; 365/196; 365/210
(58) Field of Search ................................. 365/203, 196, 365/204, 207, 210, 233

(56) References Cited

U.S. PATENT DOCUMENTS

| | | | | |
|---|---|---|---|---|
| 4,947,376 A | * | 8/1990 | Arimoto et al. | 365/205 |
| 5,815,451 A | * | 9/1998 | Tsuchida | 365/149 |
| 6,026,034 A | * | 2/2000 | Suzuki et al. | 365/189.08 |
| 6,049,493 A | * | 4/2000 | Kitamoto et al. | 365/203 |
| 6,236,605 B1 | * | 5/2001 | Mori et al. | 365/189.09 |

FOREIGN PATENT DOCUMENTS

| | | |
|---|---|---|
| JP | 9-297992 | 11/1997 |
| JP | 10-144083 | 5/1998 |

OTHER PUBLICATIONS

L. Heller, et al., "High Sensitivity Charge–Transfer Sense Amplifier", IEEE Journal of Solid–State Circuits, vol. SC–11, No. 5, Oct. 1976, pp. 596–601.

M. Tsukude, et al., "A 1.2–to 3.3–V Wide Voltage–Range/Low–Power DRAM with a Charge–Transfer Presensing Scheme", IEEE Journal of Solid–State Circuits, vol. 32, No. 11, Nov. 1997, pp. 1721–1727.

* cited by examiner

*Primary Examiner*—Thong Le
(74) *Attorney, Agent, or Firm*—Banner & Witcoff, Ltd.

(57) ABSTRACT

First of all, bit lines and sense amplifier nodes are precharged separately. Thereafter, the precharged state of the bit lines is canceled, and the gate level of each charge transfer transistor is raised to an appropriate value while the sense amplifier nodes are maintained in the precharged state, thereby copying the threshold voltage difference between the charge transfer transistors as the potential difference between the pair of bit lines. The precharged state of the sense amplifier nodes is then canceled, and the gate level of the charge transfer transistor is raised to an appropriate value, thereby reading out data from the memory cell to the sense amplifier nodes.

13 Claims, 8 Drawing Sheets

SEMICONDUCTOR MEMORY

CROSS-REFERENCE TO RELATED APPLICATIONS

This application is based upon and claims the benefit of priority from the prior Japanese Patent Application No. 2000-353237, filed Nov. 20, 2000, the entire contents of which are incorporated herein by reference.

BACKGROUND

The present invention relates to a semiconductor memory and, more particularly, to a charge transfer sense amplifier for amplifying a small signal read out from a memory cell.

[A]

A current DRAM (Dynamic Random Access Memory) in which a memory cell is comprised of one transistor and one capacitor (1T1C cell) is mainstream.

In a DRAM having a memory cell arrays constituted by such memory cells arranged in the form of a matrix, for example, data read operation is executed in the following steps.

First of all, a bit line is precharged to set it at a precharge potential. The precharging of the bit line is then stopped, and the bit line is set in a floating state. Thereafter, a high potential is applied to a word line to turn on the transfer gate (transistor) of the memory cell.

In this case, since data is stored as the amount of charge stored in the capacitor in the memory cell, when the transfer gate of the memory cell is turned on, the amount of charge corresponding to a data value ("0" or "1") stored in the memory cell is transferred from the memory cell to the bit line, and the charge is shared between the memory cell and the bit line.

At this time, the potential of the bit line varies from the precharge potential by a value corresponding to the amount of charge output from the memory cell. If, therefore, this change of the potential of the bit line is sensed and amplified by the sense amplifier, data can be read out from the memory cell.

A read scheme in which such a bit line and memory cell (capacitor) share charge will be referred to as a "charge-shared sense scheme".

In actual data read operation, a pair of bit lines are used. For example, data is output to one of the pair of bit lines, and the other is maintained at the precharge potential (or reference potential). The small potential difference between the pair of bit lines is sensed by the sense amplifier and amplified.

A potential change $\Delta Vb1$ of a bit line due to cell data (the amount of charge) can be expressed by $$\Delta Vb1 = VBLH/2 \cdot (1 + Cb/Cs)$$

where Cb is the bit line capacitance (all the capacitance produced in the bit line), Cs is the cell capacitance (the capacitance of the cell capacitor), VBLH is the "H (High)" level of the potential amplitude of the bit line, and VBLH/2 is the precharge potential of the bit line.

In this case, a ratio Cb/Cs of the bit line capacitance Cb, which serves as a parameter for determining the potential change $\Delta Vb1$, to the cell capacitance Cs is preferably minimized.

A 1T1C cell has been used from the days when a DRAM had a memory capacity of several kilobits to the present time when a DRAM at the gigabit level is under development. As a cell data read scheme as well, the above charge-shared sense scheme is generally used.

In the most advanced DRAM, a memory cell array or bit line is divided to decrease the length of each bit line so as to decrease the bit line capacitance Cb.

The cell capacitance (the capacitance of the storage node of the cell capacitor) Cs is increased by forming the cell capacitor into a 3D structure called a trench or stacked structure.

More specifically, in the trench structure, attempts have been made to increase the cell capacitance Cs by increasing the depth of a trench and increasing the aspect ratio of the trench. In the stack structure, attempts have been made to increase the cell capacitance Cs by devising the capacitor shape. There have been tendencies to decrease the Cb/Cs ratio in this manner.

This is because a decrease in the power supply voltage VBLH of a memory cell array associated with the problem of power consumption and a reduction in effective cell capacitance (a reduction in signal amount) due to leakage accompanying the prolongation of a refresh period have been compensated by a reduction in the Cb/Cs ratio.

[Problem 1]

As the size of a MOS transistor has recently been decreased extremely, the gate length has also been decreased very much. A threshold voltage Vth of the MOS transistor abruptly decreases due to the short channel effect as the gate length decreases. As the MOS transistor size decreases, variations in gate length in the manufacturing process lead to great variations in the threshold voltage Vth of the MOS transistor.

Note that a sense amplifier is generally laid out within the pitch of columns. For this reason, as the memory cell size greatly decreases, it is very difficult to reduce variations in the gate length of MOS transistors with a decrease in memory cell size.

[Problem 2]

For the above reasons, the sensing sensitivity of sense amplifiers (the minimum potential difference between a pair of bit lines which is required for a sense amplifier to appropriately amplify cell data) has hardly changed so far.

To accurately detect cell data by using a sense amplifier, therefore, a signal amount larger than a predetermined amount must be ensured.

Recently, however, as the memory cell size has decreased, the bit line capacitance Cb (especially, the capacitance produced between a pair of bit lines) has increased in a trench capacitor type memory cell. In a stack capacitor type memory cell (e.g., a COB (Capacitor Over Bitline) cell), the capacitance produced between a bit line and the storage node (especially, the contact area between a cell capacitor and a cell transistor) of a cell capacitor has increased.

Recently, therefore, with a decrease in memory cell size, it is very difficult to decrease the bit line capacitance Cb, and the bit line capacitance Cb is expected to gradually increase in the future.

It is expected that the cell capacitance Cs in, for example, a trench capacitance type memory cell, will gradually decrease with a decrease in memory cell size because the increase in the aspect ratio of a trench has approached to the process limit, and a decrease in the thickness of a capacitor insulating film is very difficult to attain in consideration of leak current and reliability. With the reduction in memory cell size, the power supply voltage (internal power supply voltage VBLH) of a memory cell array portion decreases. For this reason, it is difficult to keep the amount of signal read from a memory cell constant.

As described above, recently, as the memory cell size has decreased, it has been difficult to decrease the Cb/Cs ratio, and the Cb/Cs value has tended to increase. For this reason, the amount of signal read out from a memory cell decreases, and the potential difference between a pair of bit lines becomes less than the sensing sensitivity of the sense amplifier. As a consequence, the sense amplifier cannot sense cell data.

As for the increase in the cell capacitance Cs, a technique using a high dielectric constant film as a capacitor insulating film for a cell capacitor has been studied. It is expected that if this technique is put into practice, this problem will be left unsolved for the time being. It is, however, said that it will become impossible to read out data from a DRAM using 1T1C cells by the charge-share sense scheme in the near future.

As described above, in data read operation based on the charge-shared sense scheme, a bit line and a cell capacitor are electrically connected to each other to share charge. For this reason, with a reduction in memory cell size, as the cell capacitance Cs decreases and the bit line capacitance Cb increases, the amount of charge (signal amount) read out from the memory cell greatly decreases. As a result, the sense amplifier cannot detect cell data.

As precharge schemes for bit lines in data read operation, for example, the VBLH precharge scheme, VBLH/2 precharge scheme, and the like are known. In the VBLH/2 precharge scheme, as the voltage of the memory cell array portion decreases, the operation speed greatly decreases.

The fundamental problem that the amount of charge (signal amount) read out from a memory cell decreases with a reduction in memory cell size cannot be solved as long as the charge-shared sense scheme is used regardless of the type of precharge scheme (VBLH, VBLH/2, Vss, or the like).

[B]

A technique of solving the above fundamental problem by proposing a charge transfer sense scheme different from the above charge-shared sense scheme has been proposed by Heller et al. (L. G. Heller, D. P. Spampinato, and Y. L. Yao, "High Sensitivity Charge-transfer Sense Amplifier", IEEE J. Solid-State Circuits, vol. SC-11, No. 5, pp. 596–601, 1976).

Figure 1:
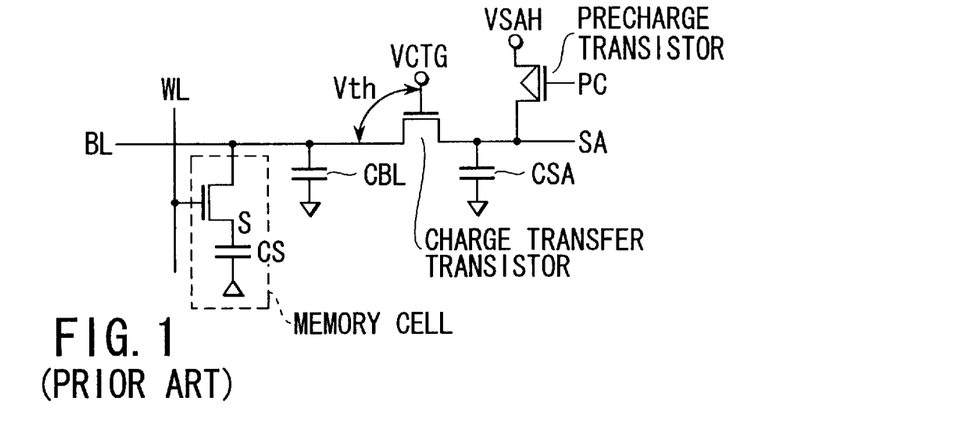
FIG. 1 is a circuit diagram showing an example of a circuit for executing read operation by the charge-shared sense scheme.
Figure 2:
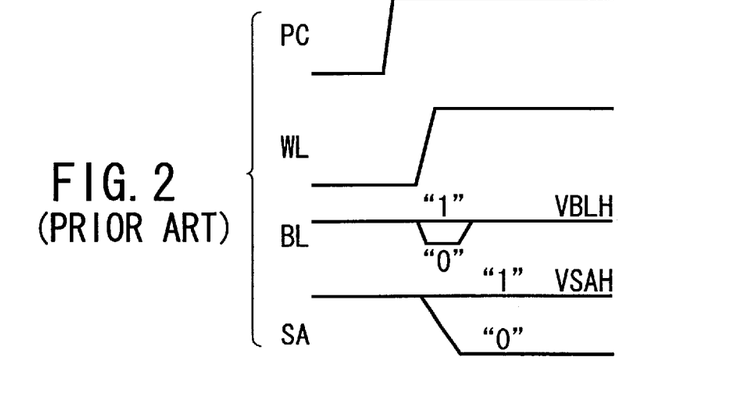
FIG. 2 is a timing chart showing the operation of the circuit in FIG. 1.

FIG. 1 is a circuit diagram for explaining the principle of the charge-transfer sense scheme proposed by Heller et al. FIG. 2 is a timing chart showing the operation of the circuit in FIG. 1.

An N-channel MOS transistor serving as a charge transfer gate is connected between a bit line BL and a sense amplitude node SA. A control signal VCTG is input to the gate of this MOS transistor. A P-channel MOS transistor is connected between the sense amplitude node SA and the VSAH node. A control signal PC is input to the gate of this MOS transistor.

At the beginning of data read operation, the control signal PC is set at a ground potential Vss, and hence the sense amplitude node SA is precharged to VSAH. In addition, since charge is supplied from the VSAH node to the bit line BL through the charge transfer transistor, the bit line BL is precharged to a value (VCTG−Vth) obtained by subtracting the threshold voltage Vth of the charge transfer transistor from the gate voltage VCTG of the charge transfer transistor (N-channel MOS transistor).

That is, the high potential VBLH of the potential amplitude of the bit line BL becomes VCTG−Vth. This potential VBLH becomes the potential of a storage node S when the cell data is "1". Note that the low potential of the potential amplitude of the bit line BL is the ground potential Vss.

Thereafter, the control signal PC is set at a power supply potential VDD to cancel the precharged state of the sense amplitude node SA and bit line BL.

Assume that a selected word line WL is set at the read potential in this state. In this case, if the cell data in a memory cell connected to the selected word line WL is "1" (the potential of the storage node S is at VBLH), since there is no potential difference between the storage node S and the bit line BL, the potential of the bit line BL does not change (is maintained at VBLH).

If the cell data in the memory cell connected to the selected word line WL is "0" (the potential of the storage node S is at Vss), since charge moves from the bit line BL to the storage node S, the potential of the bit line BL drops. If the potential of the bit line BL becomes lower than VCTG−Vth, since the charge transfer transistor is turned on, charge moves from the sense amplifier node SA to the bit line BL.

Such movement of charge from the bit line BL to the storage node S and from the sense amplifier node SA to the bit line BL continues until the potential of the bit line BL becomes VCTG−Vth and reaches an equilibrium state again.

That is, the potential of the bit line BL before the application of potential to the selected word line WL is equal to that after the application of potential, and all the charge in the sense amplifier node SA is transferred to the bit line BL and storage node S. In this case, since a capacitance CSA of the sense amplifier node SA is much smaller than a capacitance CBL of the bit line BL, a change in the potential of the sense amplifier node SA in this charge transfer sense scheme is much larger than a change in the potential of the bit line BL in the charge-shared sense scheme.

If, therefore, a large change in the potential of the sense amplifier node SA is detected by a general sense amplifier, the substantial sensing sensitivity becomes very high.

In the charge transfer sense scheme according to Heller et al., however, the bit line BL must be precharged through a charge transfer transistor. This prolongs the precharge time and cycle time.

In addition, in the charge transfer sense scheme according to Heller et al., owing to the needs of the times, the VBLH precharge scheme of setting the precharge potential of the bit line BL at VBLH is used. For this reason, to generate a reference potential VREF required to detect cell data, ① a dummy cell having the same cell capacitance as that of a memory cell is prepared, and data (the amount of charge) intermediate between "0" data and "1" data must be written in this dummy cell, or ② a dummy cell having a cell capacitance ½ that of a memory cell is prepared, and "1" data must be written in this dummy cell.

At present, however, with a reduction in memory cell size, the cell capacitance Cs is realized by a complicated 3D structure (e.g., trench capacitor or stacked capacitor). This makes it difficult to accurately generate a dummy cell having a cell capacitance ½ that of a memory cell.

It is therefore be required that a dummy cell having the same cell capacitance as that of a memory cell be prepared, and data (the amount of charge) intermediate between "0" data and "1" data be written in this dummy cell (①). In this case, for example, after one of bit lines is set at VBLH and the other bit line is set at Vss (full amplitude), an intermediate potential VREF is generated by equalizing the potentials of this pair of bit lines. This new cycle further prolongs the cycle time.

For the above reasons, the charge transfer sense scheme proposed by Heller et al. and a scheme as a combination of the charge transfer sense scheme and the VBLH precharge scheme have not been applied to DRAM products in spite of the fact that these schemes theoretically have high sensing sensitivity.

[C]

At present, with a reduction in memory cell size and a drop in the power supply voltage of a memory cell array portion, a data read failure in the charge-shared sense scheme+(VBLH/2) precharge scheme tends to become a reality.

Under the circumstances, attempts have been made to improve the sensing sensitivity and increase the read speed by combining the charge transfer sense scheme and the (VBLH/2) precharge scheme (e.g., M. Tsukude, S. Kuge, T. Fujio, and K. Arimoto, "A1.2-to3.3-V Wide Voltage-Range/Low-Power DRAM with a Charge-Transfer Presensing Scheme", IEEE J. Solid-State Circuits, vol. 32, no. 11, pp. 1721–1727, Nov, 1997).

Figure 3:
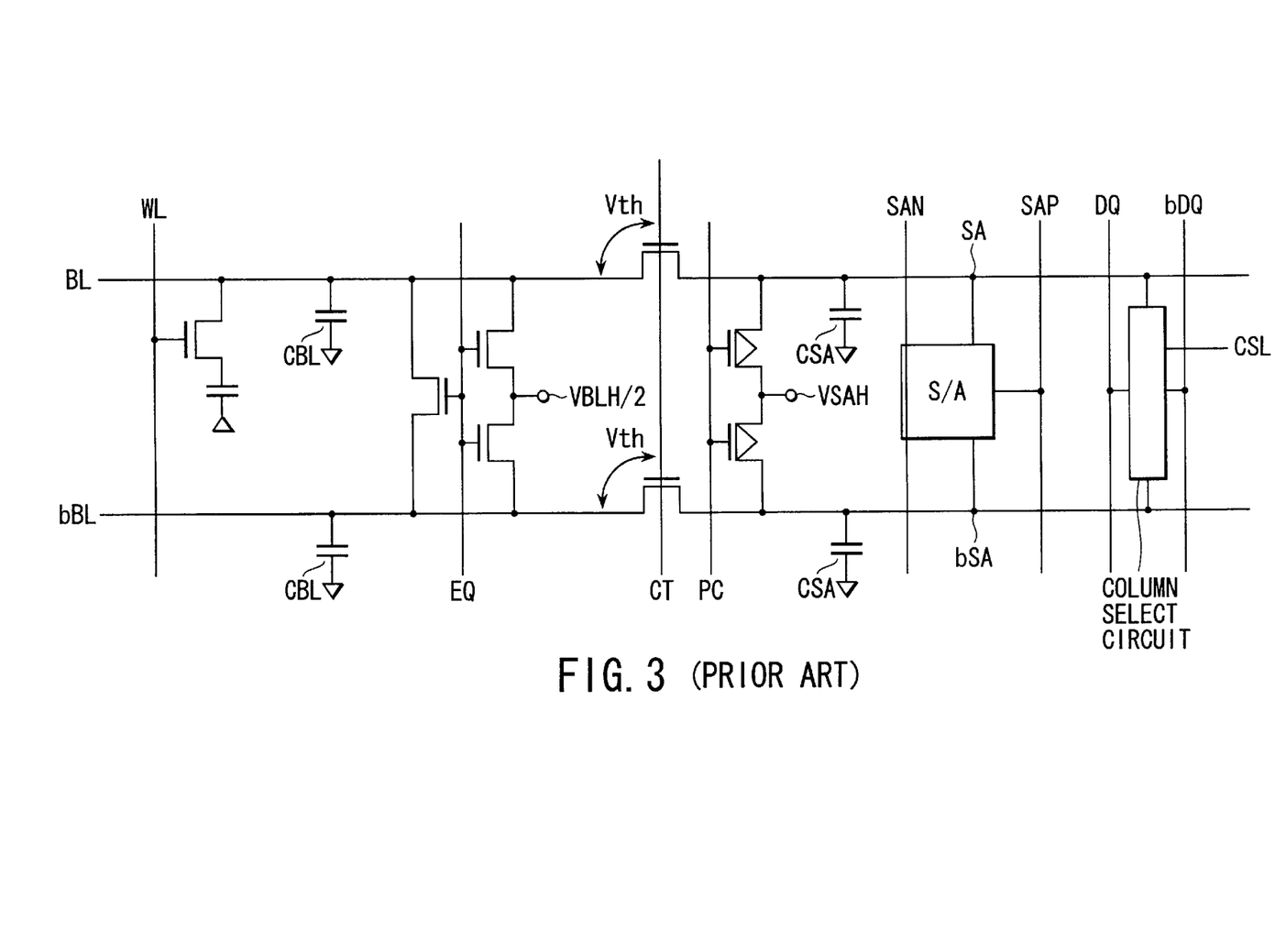
FIG. 3 is a circuit diagram showing an example of a circuit for executing read operation by the charge transfer sense scheme.
Figure 4:
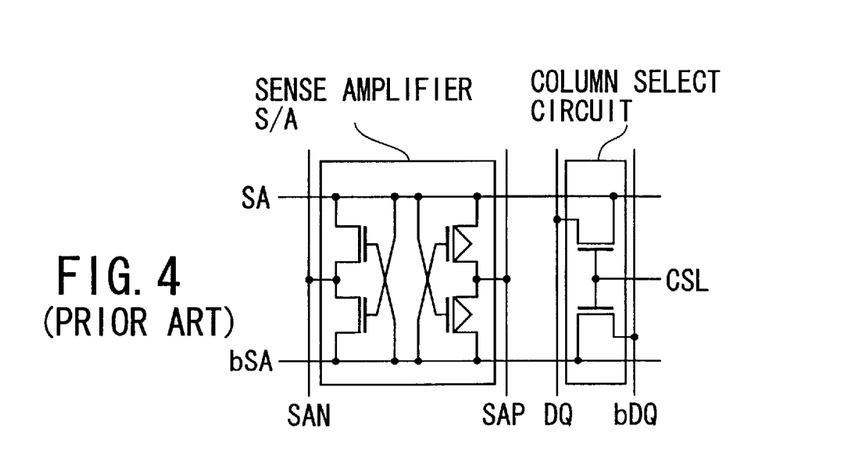
FIG. 4 is a circuit diagram showing an example of a sense amplifier and column select circuit.
Figure 5:
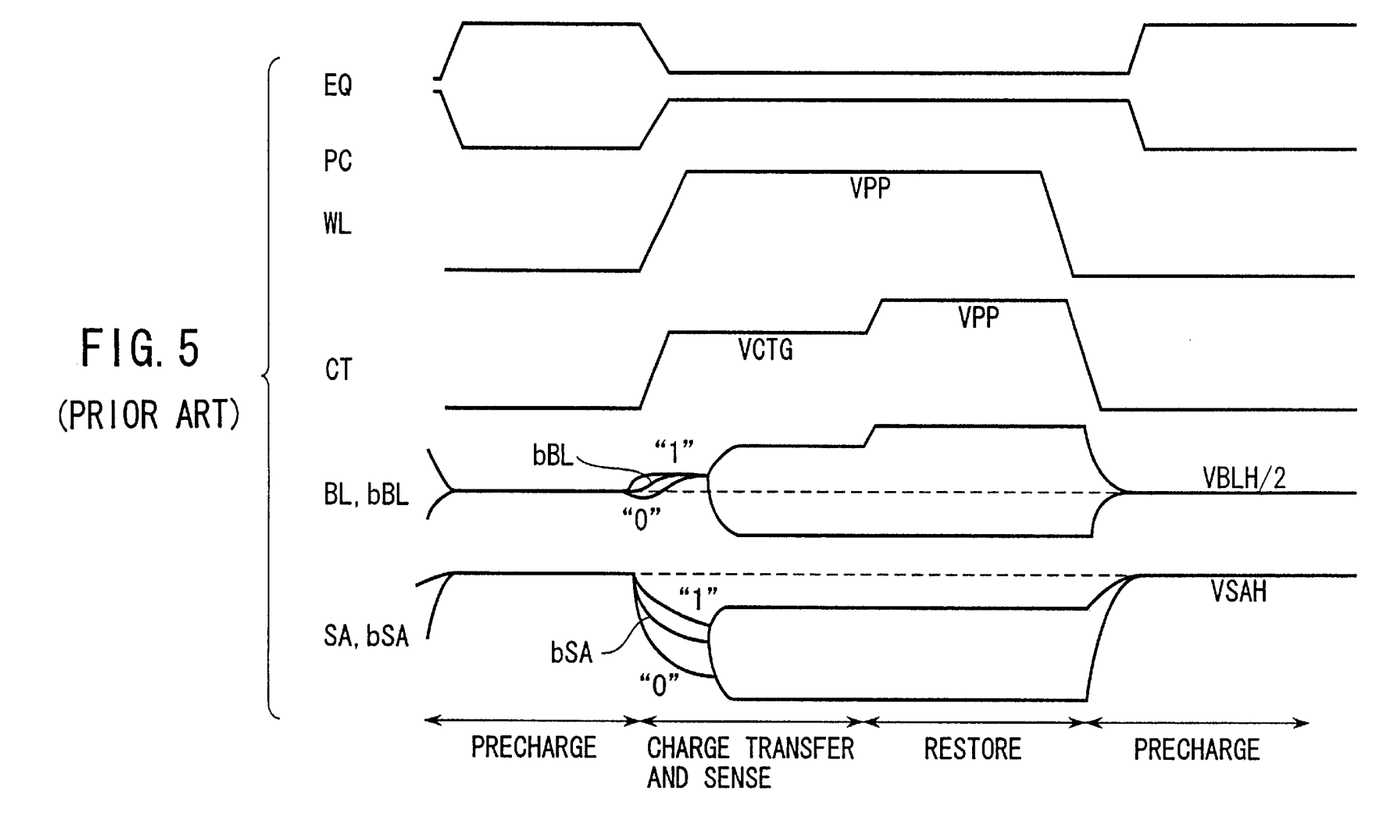
FIG. 5 is a timing chart showing the operation of the circuit in FIG. 3.

FIG. 3 is a circuit diagram for explaining the principle of data read by the charge transfer sense scheme+(VBLH/2) precharge scheme. FIG. 4 is a circuit diagram showing a concrete example of a sense amplifier and column select circuit. FIG. 5 is a timing chart showing the operation of the circuits shown in FIGS. 3 and 4.

The fundamental principle of this scheme is the same as that of the charge transfer sense scheme (FIGS. 1 and 2) proposed by Heller et al. This scheme differs from the scheme shown in FIGS. 1 and 2 in that ① bit lines and sense amplifier nodes are separately equalized and precharged, and ② the gate potential of a charge transfer transistor is controlled to change with time, instead of being fixed, in read operation.

In a precharge period, a control signal CT is at "L" level (Vss), and a charge transfer transistor is in the OFF state. In this state, since a control signal PC is at "L" level, the sense amplifier node SA and a sense amplifier node bSA are precharged to VSAH. In addition, since a control signal EQ is set at "H" level, the bit line BL and a bit line bBL are precharged to VBLH/2.

In a charge transfer/sense period, the control signal PC is set at "H" level and the control signal EQ is set at "L" level, and hence the precharged states of the sense amplifier nodes SA and bSA and bit lines BL and bBL are canceled.

Since the selected word line WL is set at VPP and the control signal CT is set at VCTG, the charge in the sense amplifier nodes SA and bSA is moved to the bit lines BL and bBL through the charge transfer transistors until the potentials of the bit lines BL and bBL are set at VCTG−Vth (where Vth is the threshold voltage of each charge transfer transistor). In addition, the charge in the bit lines BL and bBL is moved to the cell capacitor in accordance with the data in the memory cell (cell data).

If, for example, the cell data is "0", since no charge is stored in the storage node of the cell capacitor, the charge in the bit lines BL and bBL is moved to the cell capacitor. If the cell data is "1", since charge is stored in the storage node of the cell capacitor, the charge in the bit lines BL and bBL is not moved to the cell capacitor.

The amount of charge moved from the sense amplifier nodes SA and bSA to the bit lines BL and bBL varies depending on cell data.

In this case, the difference between the amount of charge moved from the sense amplifier nodes SA and bSA to the bit lines BL and bBL or the potential of the sense amplifier nodes SA and bSA after charge move when the cell data is "0" and the amount of charge moved from the sense amplifier nodes SA and bSA to the bit lines BL and bBL or the potential of the sense amplifier nodes SA and bSA after charge move when the cell data is "1" is equal to the value obtained by dividing the difference between the amount of charge stored in the cell capacitor of the memory cell storing "0" and the amount of charge stored in the cell capacitor of the memory cell storing "1" by the capacitance of the sense amplifier nodes SA and bSA.

That is, the potential difference obtained by the sense amplifier nodes SA and bSA using the charge transfer sense scheme is larger than the potential difference obtained by the sense amplifier nodes SA and bSA using the charge-shared sense scheme.

The potential difference obtained by the sense amplifier nodes SA and bSA is detected and amplified by, for example, a CMOS differential sense amplifier like the one shown in FIG. 4.

In this case, since the precharge level of the sense amplifier nodes SA and bSA is VSAH, sense amplifier activation signals SAN and SAP are also precharged to VSAH. In activating the sense amplifier, the sense amplifier activation signal SAN is set at Vss (ground potential), and the sense amplifier activation signal SAP is set at VBLH.

Note that the levels of the sense amplifier activation signals SAN and SAP in precharging the sense amplifier nodes SA and bSA may be set at VBLH and Vdd (internal power supply potential), respectively, under the condition that the sense transistor of a sense amplifier S/A is cut off.

In this case, since the potential of the sense amplifier nodes SA and bSA is higher than VBLH/2, the gate-source voltage of the sense transistor becomes high. This allows the sense amplifier to operate at high speed.

Subsequently, so-called restore operation is performed, i.e., the data read out from the memory cell is written in the memory cell again.

In the case shown in FIGS. 4 and 5, since an overall CMOS sense amplifier is arranged on the sense amplifier node side (the opposite side of a charge transfer transistor to a bit line), the control signal CT is set at a potential (e.g., VPP) higher than VCTG to let the pair of bit lines BL and bBL (or the storage node) go full swing (one of the pair of bit lines is set at VBLH, and the other at Vss).

After the restore operation, the sense amplifier nodes SA and bSA and the bit lines BL and bBL are precharged again to perform next data read.

In the charge transfer sense scheme+(VBLH/2) precharge scheme, even if it takes time more or less to do charge transfer, the time interval between the instant at which read operation is started and the instant at which the data amplified by the sense amplifier is output can be greatly shortened as a whole owing to a large read signal amount, a high gate-source voltage, and the like.

With a reduction in memory cell size, the main component of a bit line capacitance is the capacitance produced between adjacent bit lines. For this reason, in a memory cell having a trench capacitor structure, in particular, if the charge-shared sense scheme is used, the signal amount greatly decreases due to interference noise between the bit lines. In contrast to this, if the charge transfer sense scheme is used, since the potentials of a pair of bit lines after charge transfer become equal to each other, the influence of inter-bit interference noise is theoretically eliminated.

As described above, in the charge transfer sense scheme+ (VBLH/2) precharge scheme, a sense amplifier can accurately sense cell data even if the cell capacitance decreases beyond the limit of the sensing sensitivity of a sense amplifier or the operating voltage of a memory cell array drops in the charge-shared sense scheme+(VBLH/2) precharge scheme.

As described above, according to the prior art, to cope with a reduction in memory cell size and a drop in power supply voltage, high sensing sensitivity is obtained by changing the data read scheme from the charge-shared sense scheme to the charge transfer sense scheme and increasing the signal amount read out from a memory cell to a sense amplifier node. Attempts have also been made to solve the problem of the read speed in the charge transfer sense scheme by using the charge transfer sense scheme+(VBLH/2) precharge scheme.

In the charge transfer sense scheme+(VBLH/2) precharge scheme as well, however, a characteristic mismatch due to manufacturing variations occurs in a pair of charge transfer transistors arranged for each pair of bit lines, as described in association with the charge-shared sense scheme (see [Problem 1] in section [A]).

A threshold voltage Vth mismatch between a pair of charge transfer transistors, in particular, becomes an offset, which is a potential difference, between the pair of bit lines BL and bBL after charge transfer. This offset increases in the sense amplifier nodes SA and bSA and hence will greatly degrade the sensing sensitivity of the sense amplifier.

SUMMARY

A semiconductor memory according to an aspect of the present invention comprises a memory cell for storing data in the form of charge, a word line for selecting the memory cell, a bit line for reading out data from the memory cell, a sense amplifier which is connected to a sense amplifier node to amplify the data in the memory cell, a charge transfer transistor connected between the bit line and the sense amplifier node, and means for precharging the bit line and the sense amplifier node to different potentials.

DETAILED DESCRIPTION

A semiconductor memory according to an aspect of the present invention will be described in detail below with reference to the views of the accompanying drawing.

Figure 6:
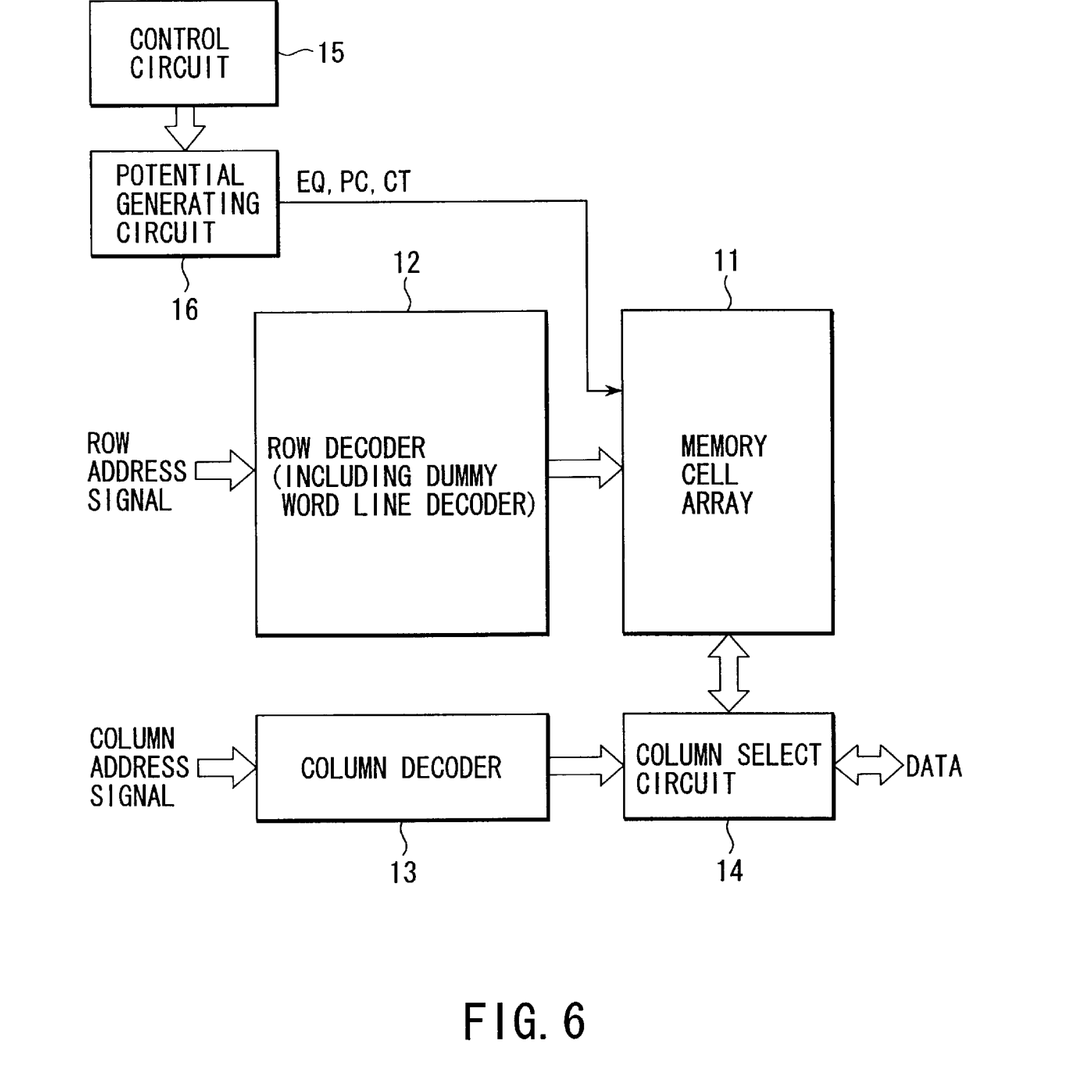
FIG. 6 is a block diagram showing the main part of a semiconductor memory according to an embodiment of the present invention.

FIG. 6 shows the main part of a semiconductor memory as an example of the present invention.

A memory cell array 11, e.g., a DRAM, is comprised of a plurality of 1T1C cells arranged in the form of an array. A row address signal is input to a row decoder (including a dummy word line decoder) 12. The row decoder 12 selects, for example, one word line on the basis of the row address signal.

A column address signal is input to a column decoder 13. The column decoder 13 ON/OFF-controls a column select circuit (column gate) 14 on the basis of the column address signal.

As will be described later, the memory cell array 11 includes an equalize circuit for equalizing the potentials of a pair of bit lines to a predetermined value, a precharge circuit for precharging the potential of a sense amplifier node to a predetermined value, and a charge transfer transistor (charge transfer gate) for transferring charge from the sense amplifier node to a bit line in read operation.

A potential generating circuit 16 generates a control signal EQ for controlling the operation of an equalize circuit, a control signal PC for controlling the operation of a precharge circuit, and a control signal CT for controlling the operation of a charge transfer transistor. A control circuit 15 controls the operation of the potential generating circuit 16.

The semiconductor memory according to this embodiment is especially characterized in the level of the control signal CT in read operation.

This characteristic feature will be briefly described below. In general, in bit line/sense amplifier precharge operation, the control signal CT is set at "L" level (e.g., ground potential Vss). In charge transfer/sense operation, the control signal CT is set at VCT (0<VCT<VPP). In restore operation, the control signal CT is set at VPP (the potential set by boosting an internal power supply potential Vdd).

In the present invention, a threshold (Vth) mismatch compensation period is newly set between a bit line/sense amplifier node precharge period and a charge transfer/sense period. In this period, the level of the control signal CT is set at VC (0<VC<VCT).

That is, when a gate potential CT of a charge transfer transistor is raised to an appropriate level VC (e.g., a value larger than (VBLH/2)+Vth) after the bit line precharge (equalize) state is canceled while the precharge potential of the sense amplifier node is maintained, the potential of the bit line rises from VBLH/2 (precharge potential) to a value VC−Vth smaller than VC by the threshold voltage Vth of the charge transfer transistor connected to the bit line.

In this threshold (Vth) mismatch compensation period, therefore, the bit line is set at a potential corresponding to the threshold voltage Vth of the charge transfer transistor connected to the bit line. As a consequence, a potential difference (offset) is produced between the pair of bit lines, which corresponds to a threshold voltage difference ΔVth between a pair of charge transfer transistors corresponding to the pair of bit lines.

As described above, according to the present invention, before a charge transfer/sense period, a potential difference (offset) is produced between a pair of bit lines, which corresponds to the threshold voltage difference ΔVth between a pair of charge transfer transistors corresponding to the pair of bit lines.

If the control signal CT is raised to VCT and charge transfer/sense operation is performed in this state, no new effect is produced by the threshold voltage mismatch of the charge transfer transistor. Therefore, the threshold voltage mismatch of the charge transfer transistor is compensated to improve the sensing sensitivity.

A concrete example of this case will be described below.

Figure 7:
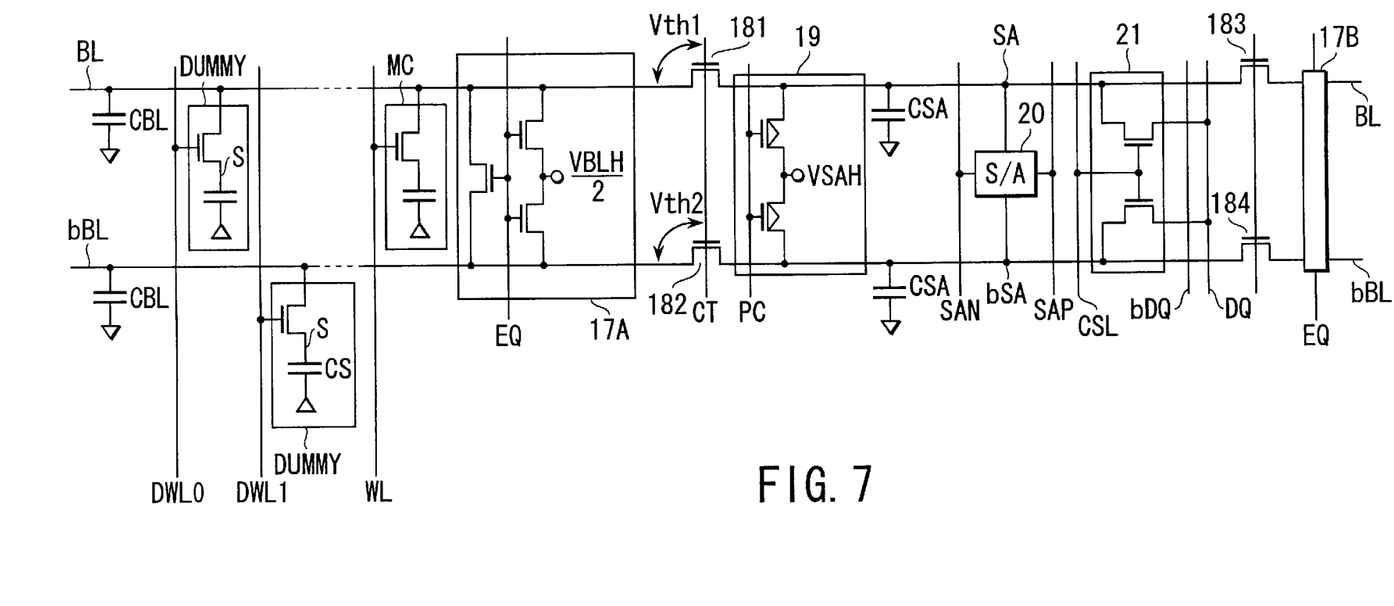
FIG. 7 is a circuit diagram showing an example of a memory cell and its peripheral circuit connected to a pair of bit lines.

FIG. 7 shows a memory cell and its peripheral circuit connected to one pair of bit lines in a memory cell array.

A memory cell MC and dummy cell DUMMY are connected to a pair of bit lines BL and bBL. Only one dummy cell DUMMY is connected to one bit line. In this case, only the memory cell MC connected to the bit line BL is shown. Obviously, however, the memory cell is also connected to the bit line bBL.

The memory cell MC and dummy cell DUMMY have the same structure. The amount of charge corresponding to "0" data or "1" data is stored the cell capacitor of the memory cell MC, whereas the amount of charge corresponding to ½ the sum of the amounts of charge corresponding to "0" data and "1" data is stored in the dummy cell DUMMY.

An equalize circuit 17A for equalizing the potentials of the bit lines BL and bBL is connected to the pair of bit lines BL and bBL. The equalize circuit 17A is comprised of three N-channel MOS transistors. When the control signal EQ is set at "H" level, these three N-channel MOS transistors are turned on. As a consequence, the pair of bit lines BL and bBL are equalized (precharged) to VBLH/2.

The bit line BL is connected to a sense amplifier node SA through a charge transfer transistor 181. The bit line bBL is connected to a sense amplifier node bSA through a charge transfer transistor 182. A sense amplifier S/A controlled by control signals SAN and SAP is connected to the sense amplifier nodes SA and bSA.

A precharge circuit 19 for precharging the sense amplifier nodes SA and bSA is connected to the sense amplifier nodes SA and bSA. The precharge circuit 19 is constituted by two P-channel MOS transistors. When the control signal PC is set at "L" level, these two P-channel MOS transistors are turned on at once. As a consequence, each of the pair of bit lines BL and bBL is precharged to VSAH.

A column select circuit (column gate) 21 is connected to the sense amplifier nodes SA and bSA. The column select circuit 21 is constituted by two N-channel MOS transistors. When a column select signal CSL is set at "H" level, these two N-channel MOS transistors are turned on. As a consequence, the pair of bit lines BL and bBL are electrically connected to a pair of data lines DQ and bDQ.

In this embodiment, since the shared sense amplifier scheme of letting two pairs of bit lines BL and bBL share one sense amplifier S/A, the sense amplifier nodes SA and bSA are interposed between charge transfer transistors 181 and 182 and charge transfer transistors 183 and 184. In addition, an equalize circuit 17B is also connected to the pair of bit lines BL and bBL on the charge transfer transistors 183 and 184 side.

Reference symbol CBL denotes a capacitance produced in a bit line; and CSA, a capacitance produced in a sense amplifier node. The capacitance CSA produced in the sense amplifier node is sufficiently smaller than the capacitance CBL produced in the bit line.

Reference symbol Vth1 denotes the threshold voltage of the charge transfer transistor 181; and Vth2, the threshold voltage of the charge transfer transistor 182. In this embodiment, the pair of charge transfer transistors 181 and 182 corresponding to the pair of bit lines BL and bBL differ in their threshold voltages due to manufacturing variations.

As the sense amplifier S/A, for example, a CMOS differential sense amplifier like the one shown in FIG. 4 can be used.

Figure 8:
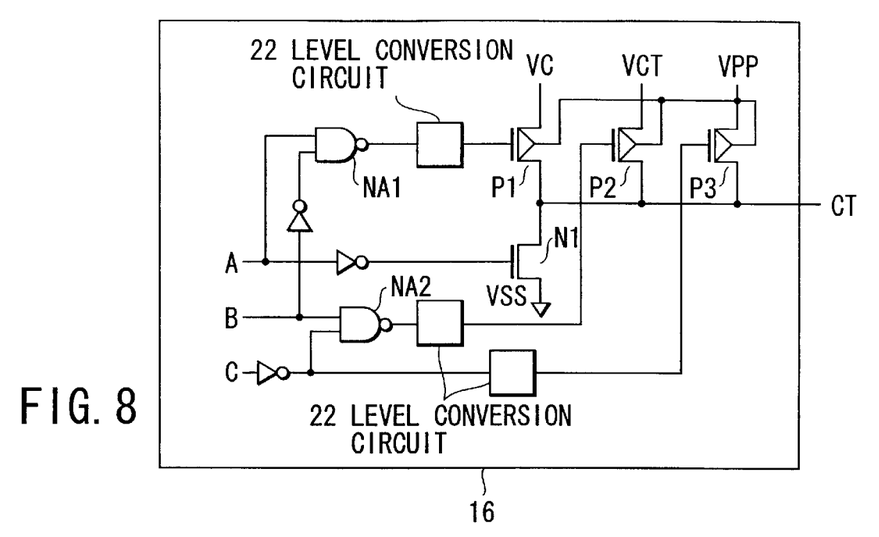
FIG. 8 is a circuit diagram showing an example of a potential generating circuit.
Figure 9:
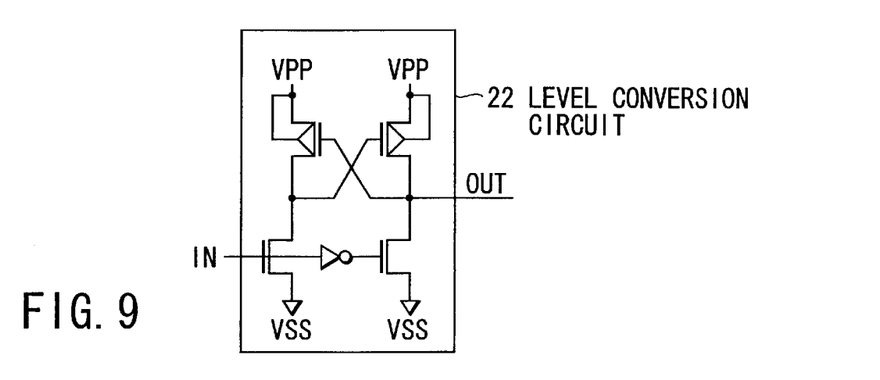
FIG. 9 is a circuit diagram showing an example of a level conversion circuit.

FIG. 8 shows a concrete example of a portion of the potential generating circuit 16 in FIG. 6 which generates the control signal CT. FIG. 9 shows an example of a level conversion circuit 22.

A control signal A is input to a NAND circuit NA1. A control signal B is input to the NAND circuit NA1 through an inverter. An output signal from the NAND circuit NA1 is input to the gate of a P-channel MOS transistor P1 through the level conversion circuit 22. The control signal A is input to the gate of an N-channel MOS transistor N1 through an inverter.

The control signal B is input a NAND circuit NA2. A control signal C is input to the NAND circuit NA2 through an inverter. An output signal from the NAND circuit NA2 is input to the gate of a P-channel MOS transistor P2 through the level conversion circuit 22.

The control signal C is input to the gate of a P-channel MOS transistor P3 through the level conversion circuit 22.

The circuit of this embodiment is designed to sequentially output potentials VC, VCT, and VPP on the basis of the levels of the control signals A, B, and C. The level conversion circuit 22 serves to convert "L" level=Vss and "H" level=Vdd into "L" level=Vss and "H" level=VPP (>Vdd).

As described above, the reason why an "H"-level value is level-converted is that the potentials of the drains (output nodes) of the P-channel MOS transistors P1, P2, and P3 rise up to VPP.

Figure 10:
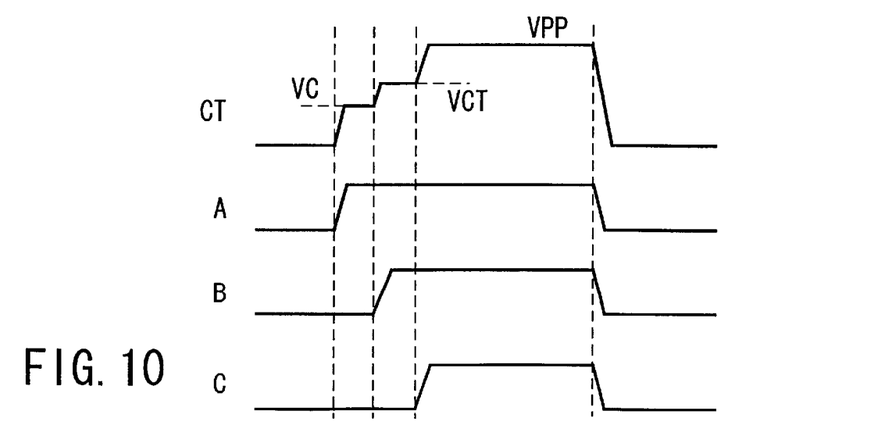
FIG. 10 is a timing chart showing the operation of the potential generating circuit in FIG. 8.

FIG. 10 shows the operation waveforms of signals in the circuit in FIG. 8.

When all the control signals A, B, and C are at "L" level, all the P-channel MOS transistors P1, P2, and P3 are in the OFF state, and the N-channel MOS transistor N1 is in the ON state. The control signal CT is therefore set at the ground potential VSS.

When the control signal A is set at "H" level (e.g., Vdd), the N-channel MOS transistor N1 is turned off. In addition, an output signal from the NAND circuit NA1 is set at "L" level, and this "L"-level potential is applied to the gate of the P-channel MOS transistor P1 through the level conversion circuit 22. As a consequence, the P-channel MOS transistor P1 is turned on, and the control signal CT is set at VC.

When the control signal B is set at "H" level (e.g., Vdd), the P-channel MOS transistor P1 is turned off. An output signal from the NAND circuit NA2 is set at "L" level. This "L"-level potential is applied to the gate of the P-channel MOS transistor P2 through the level conversion circuit 22. As a consequence, the P-channel MOS transistor P2 is turned on, and the control signal CT is set at VCT.

When the control signal C is set at "H" level (e.g., Vdd), the P-channel MOS transistor P2 is turned off. This "L"-level potential is applied to the gate of the P-channel MOS transistor P3 through the level conversion circuit 22. As a consequence, the P-channel MOS transistor P3 is turned on, and the control signal CT is set at VPP.

In the semiconductor memory according to the present invention, as shown in FIGS. 7 to 10, in read operation, the level of the control signal CT is sequentially changed as follows: Vss→VC→VCT→VPP.

In general, in bit line/sense amplifier node precharge operation, the control signal CT is set at "L" level (e.g., Vss). In charge transfer/sense operation, the control signal CT is set at VCT (0<VCT<VPP). In restore operation, the control signal CT is set at VPP (a potential set by boosting the internal power supply potential Vdd).

In this present invention, a threshold (Vth) mismatch compensation period is newly set between a bit line/sense amplifier node precharge period and a charge transfer/sense period, and the level of the control signal CT is set at VC (0<VC<VCT) in this period.

When the gate potential CT of the charge transfer transistor is raised to an appropriate level VC (e.g., a value exceeding (VBLH/2)+Vth) after the bit line precharge (equalize) state is canceled while the precharge potential of the sense amplifier node is maintained, the potential of the bit line rises to a value VC−Vth, which is lower than VC by the threshold voltage Vth of the charge transfer transistor connected to the bit line.

In this threshold (Vth) mismatch compensation period, since the bit line is set at a potential corresponding to the threshold voltage Vth of the charge transfer transistor connected to the bit line, a potential difference (offset) is produced between the pair of bit lines, which corresponds to the threshold voltage difference ΔVth between the pair of charge transfer transistors connected to the pair of bit lines.

As described above, according to the present invention, before a charge transfer/sense period, a potential difference (offset) is produced between a pair of bit lines, which corresponds to the threshold voltage difference ΔVth between the pair of charge transfer transistors corresponding the pair of bit lines in advance. If the control signal CT is then raised to VCT, and charge transfer and sense operation is performed, the mismatch between the threshold voltages of charge transfer transistors produces no effect in a charge transfer/sense period.

Figure 11:
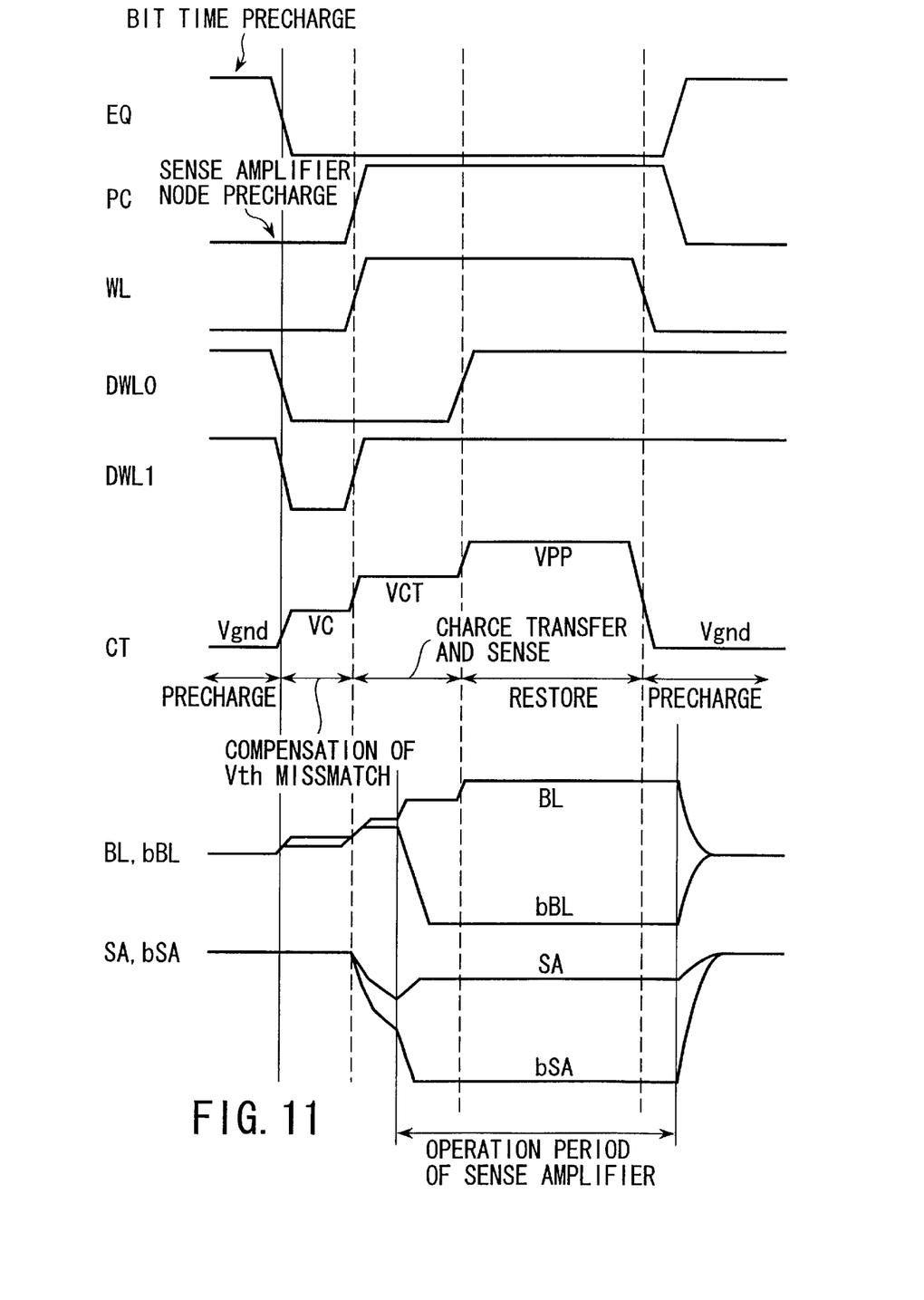
FIG. 11 is a timing chart showing the operation of the semiconductor memory according to an embodiment of the present invention.

Read operation based on the charge transfer sense scheme of the present invention will be described next with reference to the timing chart of FIG. 11.

Assume that in the following description, data is to be read out from the memory cell MC in FIG. 7 in the semiconductor memory shown in FIGS. 6 to 9. Assume that "1" data is stored in the memory cell MC in FIG. 7.

① Precharge Period

First of all, the sense amplifier nodes SA and bSA and bit lines BL and bBL are precharged. The control signal CT is set at Vss (ground potential), and the charge transfer transistors 181 and 182 are in the OFF state. Therefore, the sense amplifier nodes SA and bSA are electrically disconnected from the bit lines BL and bBL.

Since the control signal EQ is set at Vdd (internal power supply potential), the equalize circuit 17A is active, and the pair of bit lines BL and bBL are precharged to VBLH/2. Since the control signal PC is set at Vss, the precharge circuit 19 is active. Hence, the sense amplifier nodes SA and bSA are precharged to VSAH.

At this time, dummy word lines DWL0 and DWL1 are set at Vdd, and a storage node S of the dummy cell DUMMY is set at the same level as the precharge level (VBLH/2) of the bit line bBL. That is, data (charge) serving as a reference potential in read operation is written in the dummy cell DUMMY.

② Threshold (Vth) Mismatch Compensation Period

After precharge operation, the control signal EQ is changed from Vdd to Vss to turn off the equalize circuit 17A, and the precharged state of the bit lines BL and bBL is canceled.

Assume that in this embodiment, both the charge transfer transistors 183 and 184 are always set in the OFF state.

At the same time, the control signal CT is changed from Vss to VC. The level of VC is set to a value larger than the sum of the precharge level (VBLH/2) of the pair of bit lines BL and bBL and threshold voltages (Vth1, Vth2) of the charge transfer transistors.

In addition, the levels of the dummy word lines DWL0 and DWL1 are lowered to a word line reset level, i.e., Vss in this embodiment.

In this state, the potential of the bit line changes from the precharge potential to a value dependent on the threshold voltage of the charge transfer transistor connected to the bit line. That is, the potential of the bit line BL rises from VBLH/2 to VC−Vth1, and the potential of the bit line bBL rises from VBLH/2 to VC−Vth2.

Since the sense amplifier nodes SA and bSA are continuously precharged (PC=Vss) during this period, the potentials of the sense amplifier nodes SA and bSA are kept at the precharge level (VSAH). That is, in this stage, no charge transfer is performed from the sense amplifier nodes SA and bSA directly associated with data read operation to the bit lines BL and bBL.

According to the present invention, before charge is transferred from the sense amplifier nodes SA and bSA to the bit lines BL and bBL in accordance with the value of the cell data, a. the control signal CT is raised to an appropriate level (VC) to change the levels of the bit lines BL and bBL from the precharge levels (VBLH/2) to values (VC−Vth1, VC−Vth2) corresponding to the threshold voltages of the charge transfer transistors, thereby producing an offset between the bit lines BL and bBL, which depend on the threshold voltages of the charge transfer transistors.

At this time, the sense amplifier nodes SA and bSA are kept precharged so as not to change the potentials of the sense amplifier nodes SA and bSA. This prevents the offset produced between the bit lines BL and bBL from being transferred to the sense amplifier nodes SA and bSA.

This operation compensates for the mismatch between the threshold voltages of the charge transfer transistors.

In this embodiment, a threshold (Vth) mismatch compensation period is newly required. Since this period can be set to be concurrent with a word line select period before a charge transfer/sense period, no influence is exerted on the access time or the influence can be greatly reduced if any.

③ Charge Transfer/Sense Period

The control signal CT is set at the potential VCT higher than VC, and the potential of the selected word line WL is raised (to the read potential). In addition, the control signal PC is changed from Vss to Vdd to turn off the precharge circuit 19 to cancel the precharged state of the sense amplifier nodes SA and bSA.

At this time, the potential of the bit line BL changes from VC−Vth1 to VCT−Vth1, and the potential of the bit line bBL changes from VC−Vth2 to VCT−Vth2. Subsequently, charge is transferred from the sense amplifier nodes SA and bSA to the bit lines BL and bBL, and the potentials of the sense amplifier nodes SA and bSA change in accordance with the cell data of the memory cell or the data in the dummy cell.

In this embodiment, the cell data in the memory cell MC is read out to the sense amplifier node SA through the bit line BL. Therefore, the potential of the dummy word line DWL1 of the dummy cell DUMMY connected to the bit line bBL is changed from Vss to Vdd, and the dummy cell DUMMY is electrically connected to the bit line bBL.

When the dummy cell DUMMY is connected to the bit line bBL, the capacitances of the bit lines BL and bBL are equalized in charge transfer period. In addition, since VBLH/2 is written in the cell capacitor of the dummy cell DUMMY, the potential of the sense amplifier node bSA becomes an intermediate value between the potential of the sense amplifier node SA when the cell data in the memory cell MC is "1" and the potential of the sense amplifier node SA when the cell data in the memory cell MC is "0". That is, the potential of the sense amplifier node bSA becomes a reference potential suitable for the sense amplifier S/A.

In the present invention, the potential of the bit line BL before charge transfer is VC−Vth1, and the potential of the bit line BL after charge transfer is VCT−Vth1. Likewise, the potential of the bit line bBL before charge transfer is VC−Vth2, and the potential of the bit line bBL after charge transfer is VCT−Vth2. That is, both changes in the potentials of the bit lines BL and bBL before and after charge transfer are VCT−VC, and hence the amounts of charge transferred from the sense amplifier nodes SA and bSA to the bit lines BL and bBL are influenced by only the data in the memory cell MC or the data in the dummy cell DUMMY but are not influenced by the threshold voltages Vth1 and Vth2 of the charge transfer transistors 181 and 182.

Changes in the potentials of the sense amplifier nodes SA and bSA are therefore not influenced by the threshold voltages Vth1 and Vth2 of the charge transfer transistors 181 and 182.

In the conventional read method, since the potentials of the bit lines BL and bBL before charge transfer become VBLH/2 and the potentials of the bit lines BL and bBL after charge transfer become VCT−Vth, changes in the potentials of the bit lines BL and bBL become VCT−(VBLH/2)−Vth. That is, the amounts of charge transferred from the sense amplifier nodes SA and bSA to the bit lines BL and bBL are influenced by the threshold voltage Vth of each charge transfer transistor.

Since this embodiment is based on the assumption that the cell data in the memory cell MC is "1", the amount of charge transferred from the sense amplifier node SA to the bit line BL is smaller than the amount of charge transferred from the sense amplifier node bSA to the bit line bBL. For this reason, a decrease in the potential of the sense amplifier node SA is smaller than a decrease in the potential of the sense amplifier node bSA, and the potential of the sense amplifier node SA after charge transfer becomes higher than that of the sense amplifier node bSA after charge transfer.

When the potential difference between these sense amplifier nodes SA and bSA is sensed and amplified by the sense amplifier S/A, the potential difference between the sense amplifier nodes SA and bSA and the potential difference between the bit lines BL and bBL become sufficiently large.

The potentials VC, VCT, and VSAH are respectively set to appropriate values, on the condition that charge transfer is performed, in such a manner that when the potentials of the sense amplifier nodes SA and bSA drop from VSAH by predetermined values after charge transfer, the potentials of the sense amplifier nodes SA and bSA do not become lower than VCT−Vth1 or VCT−Vth2.

In this embodiment, since the potentials of the sense amplifier nodes SA and bSA after charge transfer are higher than VBLH/2, the gate-source voltage of the N-channel MOS transistor (see FIG. 4) of the sense amplifier S/A becomes higher than that in the conventional VBLH/2 precharge scheme, thus realizing high-speed operation.

④ Restore

After charge transfer and sense operation, the control signal CT is set at VPP, and the potential of the dummy word line DWL0 is changed from Vss to Vdd to write the data, which has been read out from the memory cell MC, in the memory cell MC again, thus performing so-called restore operation.

In this case, the control signal CT is raised to VPP (>Vdd) to sufficiently restore the cell data in the memory cell MC when the cell data is "1". If, therefore, it is obvious that "1" data can be sufficiently restored in the memory cell MC, the control signal CT may be set at Vdd instead of VPP obtained by boosting Vdd.

In this embodiment, in restore operation, the potential of the dummy word line DWL0 of the dummy cell DUMMY connected to the bit line BL to which the accessed memory cell MC is connected is raised.

The above operation is performed for the following reason. Assume that access operation is continuously performed. In this case, in restore operation, if both the potentials of the two dummy word lines DWL0 and DWL1 are set at Vdd, the capacitance between the pair of bit lines BL and bBL become uniform during a precharge period (see ①) described above) in the next access operation, and the pair of bit lines BL and bBL can be precharged to VBLH/2 by equalize operation alone.

If the capacitance between the pair of bit lines BL and bBL is not uniform during a precharge period, the charge corresponding to the capacitance difference must be externally compensated. In general, in equalize circuit 17A for equalizing the potentials of the pair of bit lines BL and bBL, VBLH/2 is supplied from a transistor having a current driving capacity as small as a leak current from each bit line to prepare for a fault such as a short circuit between the word line and the bit line.

When, therefore, the charge corresponding to the capacitance difference between the pair of bit lines BL and bBL is to be externally compensated, it takes a long period of time to compensate for the charge. As a consequence, the precharge time for a bit line is prolonged.

In this embodiment, since both the potentials of the two dummy word lines DWL0 and DWL1 are set at Vdd, such a problem does not arise.

After the restore operation, the word line WL is set at the reset level Vss, and the control signal CT is also set at the reset level Vss of the word line. After the sense amplifier S/A is turned off, the bit lines BL and bBL and sense amplifier nodes SA and bSA are precharged.

The semiconductor memory according to the present invention has been described above. The present invention can be variously modified within the gist of the present invention.

A modification of the semiconductor memory according to the present invention will be described below.

Figure 12:
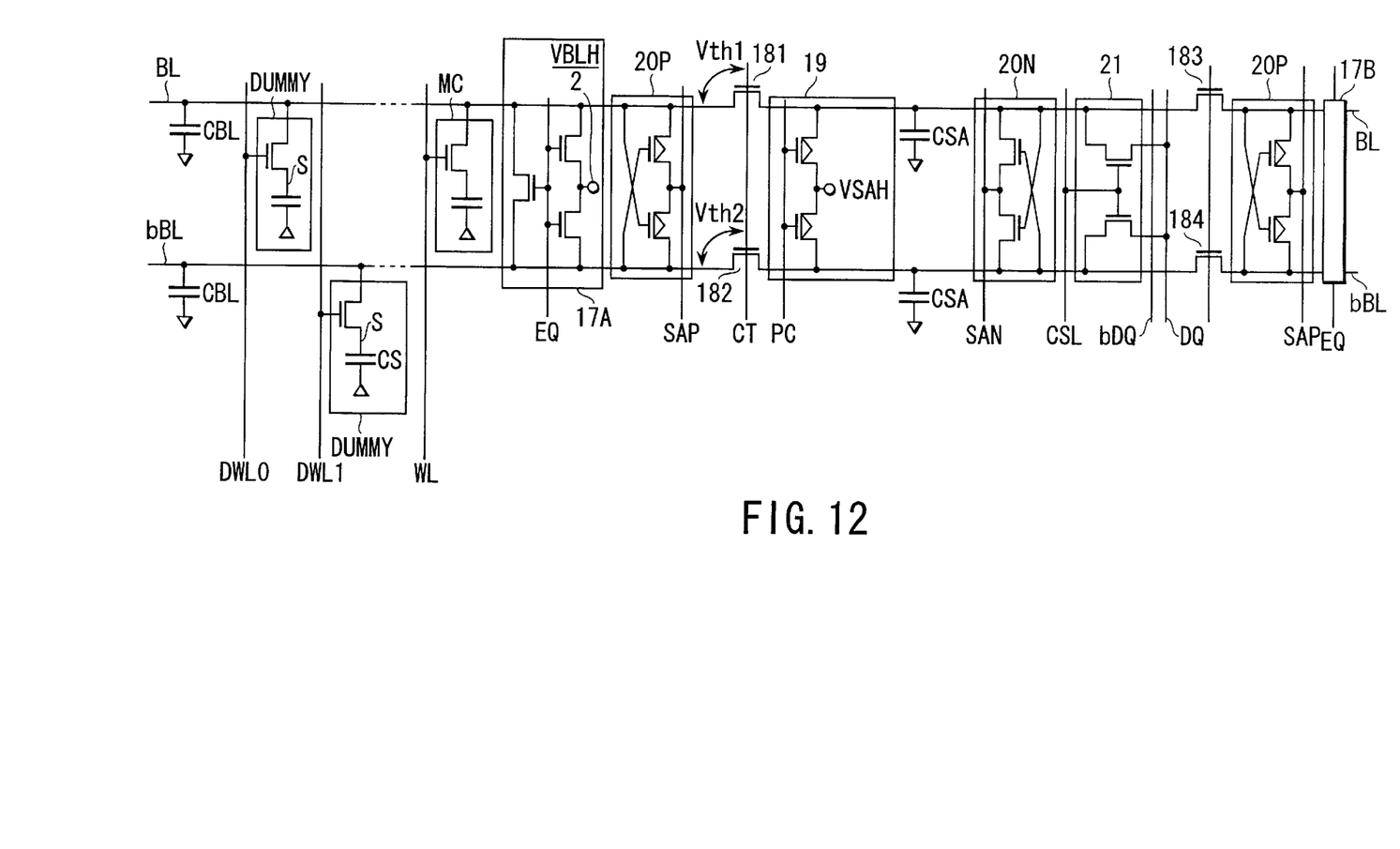
FIG. 12 is a circuit diagram showing another example of the memory cell and its peripheral circuit connected to the pair of bit lines.

FIG. 12 shows a modification of the memory cell and its peripheral circuit in FIG. 7.

The memory cell MC and dummy cell DUMMY are connected to the pair of bit lines BL and bBL. The dummy cell DUMMY is connected to only one bit line. In this modification, only the memory cell MC connected to the bit line BL is shown. Obviously, however, the memory cell is also connected to the bit line bBL.

The memory cell MC and dummy cell DUMMY have substantially the same structure. The amount of charge corresponding to "0" data or "1" data is stored in the cell capacitor of the memory cell MC, whereas the amount of charge corresponding to ½ the sum of the amount of charge corresponding to "0" data and the amount of charge corresponding to "1" data is stored in the cell capacitor of the dummy cell DUMMY.

The equalize circuit 17A for equalizing the potentials of the bit lines BL and bBL is connected to the pair of bit lines BL and bBL. The equalize circuit 17A is comprised of three N-channel MOS transistors. When the control signal EQ is set at "H" level, since these three N-channel MOS transistors are turned on, the potentials of the pair of bit lines BL and bBL are equalized (precharged) to VBLH/2.

The bit line BL is connected to the sense amplifier node SA through the charge transfer transistor 181. The bit line bBL is connected to the sense amplifier node bSA through the charge transfer transistor 182. An N-channel MOS transistor portion 20N of the CMOS sense amplifier S/A controlled by the control signal SAN is connected to the sense amplifier nodes SA and bSA.

A P-channel MOS transistor portion 20P of the CMOS sense amplifier S/A controlled by the control signal SAP is directly connected to the pair of bit lines BL and bBL. The P-channel MOS transistor portion 20P of the CMOS sense amplifier S/A is prepared for each pair of bit lines BL and bBL.

The precharge circuit 19 for precharging the sense amplifier nodes SA and bSA is connected to the sense amplifier nodes SA and bSA. The precharge circuit 19 is comprised of two P-channel MOS transistors. When the control signal PC is set at "L" level, these two P-channel MOS transistors are turned on to precharge each pair of bit lines BL and bBL to VSAH.

The column select circuit (column gate) 21 is connected to the sense amplifier nodes SA and bSA. The column select circuit 21 is constituted by two N-channel MOS transistors. When the column select signal CSL is set at "H" level, since these two N-channel MOS transistors are turned on, the pair of bit lines BL and bBL are electrically connected to the pair of data lines DQ and bDQ.

In this modification, for example, two pairs of bit lines BL and bBL are shared by the N-channel MOS transistor portion 20N of the CMOS sense amplifier S/A, the P-channel MOS transistor portion 20P of set for each pair of bit lines BL and bBL, and the P-channel MOS transistor portion 20P is set to be closer to the pair of bit lines BL and bBL than the charge transfer transistors 181, 182, 183, and 184.

In this case, since the potentials of the pair of bit lines BL and bBL are directly amplified by the P-channel MOS transistor portion 20P of the CMOS sense amplifier S/A in restore operation, there is no need to raise the level of the control signal CT from VCT to VPP.

In this case, however, since the P-channel MOS transistor portion 20P of the CMOS sense amplifier S/A is required for each pair of bit lines BL and bBL, the area of the sense amplifier increases as compared with the case where the overall CMOS sense amplifier S/A is shared among a plurality of pairs of bit lines BL and bBL.

Therefore, whether to use the circuit in FIG. 7 or the circuit in FIG. 12 is determined in consideration of the specifications of a semiconductor memory as a target for development and the like.

Additional advantages and modifications will readily occur to those skilled in the art. Therefore, the invention in its broader aspects is no limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a memory cell for storing data in the form of charge;
   a word line for selecting said memory cell;
   a bit line for reading out data from said memory cell;
   a sense amplifier which is connected to a sense amplifier node to amplify the data in said memory cell;
   a charge transfer transistor connected between said bit line and said sense amplifier node; and
   a precharge circuit for precharging said bit line and said sense amplifier node to different potentials, and
   a control circuit for canceling precharge operation for said bit line while maintaining precharge operation for said sense amplifier node, and changing a potential of said bit line to a value dependent on a threshold voltage of said charge transfer transistor by controlling a gate potential of said charge transfer transistor before said sense amplifier is operated.

2. The memory according to claim 1, wherein said control circuit changes the potential of the bit line to a value dependent on the threshold voltage of said charge transfer transistor, then cancels a precharged state of said sense amplifier node, and reads out data from the memory cell to said sense amplifier node by controlling the gate voltage of said charge transfer transistor.

3. The memory according to claim 1, wherein said charge transfer transistor comprises an N-channel MOS transistor.

4. The memory according to claim 3, wherein the gate potential of said charge transfer transistor in reading out the data in said memory cell to said sense amplifier node is higher than the gate potential of said charge transfer transistor in changing the potential of said bit line to a value dependent on the threshold voltage of said charge transfer transistor.

5. The memory according to claim 1, wherein said bit line is kept precharged until the potential of said bit line becomes an intermediate value of a potential amplitude of said bit line.

6. The memory according to claim 1, wherein said sense amplifier comprises a differential sense amplifier.

7. The memory according to claim 6, wherein said bit line and the other bit line different from said bit line constitute a bit line pair, and said bit line and said other bit line are connected to dummy cells, respectively, for generating a reference potential for said sense amplifier.

8. The memory according to claim 7, wherein when the potential of said bit line is to be changed to a value dependent on the threshold voltage of said charge transfer transistor, both said dummy cell connected to said bit line and said dummy cell connected to said other bit line are set in an unselected state.

9. The memory according to claim 7, wherein when the data in the memory cell is to be read out to said sense amplifier node, one of said dummy cells connected to said bit line and said dummy cell connected to said other bit line is set in a selected state.

10. The memory according to claim 7, wherein when said bit line is to be precharged, data for generating the reference potential are written in said dummy cell connected to said bit line and said dummy cell connected to said other bit line.

11. The memory according to claim 7, wherein said memory cell comprises one transistor and one capacitor.

12. The memory according to claim 7, wherein said memory cell and said dummy cells substantially have the same structure.

13. The memory according to claim 12, wherein when an amount of charge corresponding to "0" data or "1" data is to be stored in a cell capacitor of said memory cell, an amount of charge corresponding to ½ a sum of an amount of charge corresponding to the "0" data and an amount of charge corresponding to the "1" data is stored in a cell capacitor of said dummy cell.

* * * * *